(12) United States Patent
Kwack et al.

(10) Patent No.: US 9,064,708 B2
(45) Date of Patent: Jun. 23, 2015

(54) DISPLAY PANEL, CHIP ON FILM AND DISPLAY DEVICE INCLUDING THE SAME

(71) Applicant: Samsung Display Co., Ltd., Gyeonggi-do (KR)

(72) Inventors: Jun-Ho Kwack, Yongin (KR); Joon-Sam Kim, Yongin (KR); Jong-Hwan Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/028,809

(22) Filed: Sep. 17, 2013

(65) Prior Publication Data

US 2014/0124803 A1  May 8, 2014

(30) Foreign Application Priority Data

Nov. 6, 2012 (KR) .................. 10-2012-0124936

(51) Int. Cl.
*H01L 29/205* (2006.01)
*H01L 23/00* (2006.01)
*G02F 1/1345* (2006.01)

(52) U.S. Cl.
CPC ............... *H01L 24/06* (2013.01); *H01L 24/29* (2013.01); *H01L 24/32* (2013.01); *H01L 24/73* (2013.01); *H01L 2224/06051* (2013.01); *H01L 2224/0612* (2013.01); *H01L 2224/16225* (2013.01); *H01L 2224/2929* (2013.01); *H01L 2224/29298* (2013.01); *H01L 2224/32225* (2013.01); *H01L 2224/73204* (2013.01); *H01L 2224/83851* (2013.01); *H01L 2924/07811* (2013.01); *H01L 2924/12041* (2013.01); *G02F 1/13458* (2013.01)

(58) Field of Classification Search
CPC ... H01L 23/49816; H01L 23/52; H01L 24/06; H01L 24/09; H01L 24/10; H01L 27/124
USPC .............................. 257/91, 737; 349/149, 152
See application file for complete search history.

(56) References Cited

U.S. PATENT DOCUMENTS 7,714,972 B2 * 5/2010 Wang ............................ 349/149
2006/0146263 A1 * 7/2006 Park et al. ..................... 349/149

FOREIGN PATENT DOCUMENTS

| JP | 2009-094361 | 4/2009 |
| JP | 2012-060029 | 3/2012 |
| KR | 10-2007-0048849 A | 5/2007 |
| KR | 10-2012-0052764 A | 5/2012 |

* cited by examiner

*Primary Examiner* — Brook Kebede
(74) *Attorney, Agent, or Firm* — Lee & Morse, P.C.

(57) ABSTRACT

A display panel includes a display area including a display element, and a non-display area adjacent to the display area, the non-display area including a plurality of conductive pads. The conductive pads are spaced apart at a predetermined distance so as to form a first pad row and a second pad row, the conductive pads collectively having a center portion and lateral portions. A distance between the first pad row and the second pad row is greater at at least one of the lateral end portions than at the center portion.

11 Claims, 12 Drawing Sheets

DISPLAY PANEL, CHIP ON FILM AND DISPLAY DEVICE INCLUDING THE SAME

CROSS-REFERENCE TO RELATED APPLICATION

This application claims priority under 35 U.S.C. §119 to Korean Patent Application No. 10-2012-0124936, filed in the Korean Intellectual Property Office on Nov. 6, 2012, the entire contents of which are incorporated herein by reference.

BACKGROUND

1. Field

Embodiments relate generally to a display panel, a chip on film, and a display device including the same.

2. Description of the Related Art

Display devices include liquid crystal displays (LCD), organic light emitting diode (OLED) displays, or the like. Particularly, the organic light emitting diode display includes a display substrate that provides pixel areas and non-pixel areas, and an encapsulation substrate disposed to face the display substrate for encapsulation. The encapsulation substrate is bonded with the display substrate by a sealant such as epoxy. Light emitting elements, which are connected in a matrix manner so as to configure the pixels, are formed between scan lines and data lines in the pixel area of the display substrate. A scan driver and a data driver are formed in the non-pixel area and extend from the scan lines and the data lines in the pixel area. The scan driver and the data driver process signals provided from the outside via a pad, and supply the signals to the scan line and the data line. The scan driver and the data driver include a driving circuit that processes the signals provided from the outside and produces scan signals and data signals. The scan driver and the data driver are mounted on the display substrate after being formed in a manufacturing process for the light emitting element or after being manufactured as individual integrated circuit chips.

SUMMARY

Embodiments are directed to a display panel including a display area including a display element and a non-display area adjacent to the display area, the non-display area including a plurality of conductive pads. The conductive pads are spaced apart at a predetermined distance so as to form a first pad row and a second pad row, the conductive pads collectively having a center portion and lateral end portions. A distance between the first pad row and the second pad row is greater at at least one of the lateral end portions than at the center portion.

The distance between the first pad row and the second pad row may gradually increase from the center portion to the at least one of the lateral end portions.

Among the conductive pads, a length of a conductive pad positioned at the center portion of the first pad row may be greater than a length of a conductive pad positioned at the at least one of the lateral end portions.

A length of the conductive pad positioned at the center portion of the first pad row may be greater than lengths of conductive pads positioned at each of the lateral end portions.

The lengths of the conductive pads may gradually decrease from the center portion to each of the lateral end portions.

A difference in length between conductive pads neighboring each other may be about 3 μm to about 7 μm.

Conductive pads in the first pad row and conductive pads in the second pad row may be not aligned with each other.

The display panel may further include a third pad row in the non-display area between the first pad row and the second pad row.

A distance between the first pad row and the third pad row may gradually increase from the center to at least one of the lateral end portions.

Embodiments are also directed to a chip on film including an insulation layer, a first conductive layer and a second conductive layer on the insulation layer, and a driving chip connected to the first conductive layer and the second conductive layer. The first conductive layer is exposed through a cut-out portion of the insulation layer so as to form a first bumper row, and the second conductive layer is exposed through the cut-out portion of the insulation layer so as to form a second bumper row. The first bumper row and the second bumper row each include a plurality of conductive bumpers spaced apart from each other, the conductive bumpers collectively having a center portion and lateral end portions. A distance between the first bumper row and the second bumper row is greater at at least one of the lateral end portions than at the center portion.

The distance between the first bumper row and the second bumper row may gradually increase from the center portion to the at least one of the lateral end portions.

A length of a conductive bumper positioned at the center portion of the first bumper row may be greater than lengths of conductive bumpers positioned at each of the lateral end portions.

The lengths of the conductive bumpers may decrease from the center portion to each of the lateral end portions.

A difference in length between conductive bumpers neighboring each other may be about 3 μm to about 7 μm.

Conductive pads disposed in the first bumper row and conductive pads in a second pad row may not be aligned with each other.

The chip on film may further include a third pad row between a first pad row and the second pad row.

A distance between the first bumper row and a third bumper row may gradually increase from a center thereof to an outer side.

Embodiments are also directed to a display device including a display area including a display element, a non-display area adjacent to the display area, the non-display area including a plurality of conductive pads, a chip on film having conductive bumpers that are connected to respective ones of the conductive pads in the non-display area, and a printed circuit board connected to the chip on film. The conductive pads are spaced apart a predetermined distance so as to form a first pad row and a second pad row, the conductive pads collectively having a center portion and lateral end portions. A distance between the first pad row and the second pad row is greater at at least one of the lateral end portions than at the center portion.

The conductive pads and the conductive bumpers may be bonded by an anisotropic conductive film including an adhesive layer and a conductive ball disposed in the adhesive layer.

The distance between the first pad row and the second pad row may gradually increase from the center portion to the at least one of the lateral end portions.

Lengths of the conductive pads may gradually decrease from the center portion to each of the lateral end portions.

A difference in length between conductive pads neighboring each other may be about 3 μm to about 7 μm.

Conductive pads disposed in the first pad row and conductive pads disposed in the second pad row may not be aligned with each other.

The display device may further include a third pad row formed in the non-display area between the first pad row and the second pad row.

A distance between the first pad row and the third pad row may gradually increase from a center thereof to at least one of the lateral end portions.

The chip on film may include a first bumper row and a second bumper row including a plurality of conductive bumpers, the conductive bumpers collectively having a center portion and lateral portions. A distance between the first bumper row and the second bumper row may be greater at at least one of the lateral end portions than at the center portion.

The distance between the first bumper row and the second bumper row may gradually increase from the center portion to the at least one of the lateral end portions.

BRIEF DESCRIPTION OF THE DRAWINGS

Features will become apparent to those of ordinary skill in the art by describing in detail exemplary embodiments with reference to the attached drawings in which.

DETAILED DESCRIPTION

Embodiments will be described more fully hereinafter with reference to the accompanying drawings, in which exemplary embodiments thereof are shown. As those skilled in the art would realize, the described embodiments may be modified in various different ways, all without departing from the spirit or scope thereof.

The drawings and description are to be regarded as illustrative in nature and not restrictive. Like reference numerals designate like elements throughout the specification.

Further, the size and thickness of each configuration shown in the drawings are arbitrarily shown for understanding and ease of description, without being limiting.

In the drawings, the thickness of layers, films, panels, regions, etc., are exaggerated for clarity. Further, in the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, as a display device, an organic light emitting diode display including an organic emission layer will be described as an exemplary embodiment, hereinafter, but in other implementations, the display device may be a display device such as a liquid crystal display, a plasma display panel, a field emission display or the like.

Further, although an active matrix (AM) type organic light emitting diode (OLED) display of a 2Tr-1Cap structure in which one pixel has two thin film transistors (TFTs) and one capacitor is illustrated in the accompanying drawing, the organic light emitting diode (OLED) display is not limited by the illustrated number of thin film transistors, capacitors, and wires. Meanwhile, the pixel refers to a minimum unit for representing an image. The organic light emitting display panel displays an image using a plurality of pixels.

Hereinafter, a display device according to an exemplary embodiment will be described with reference to FIGS. 1 to 8.

Figure 1:
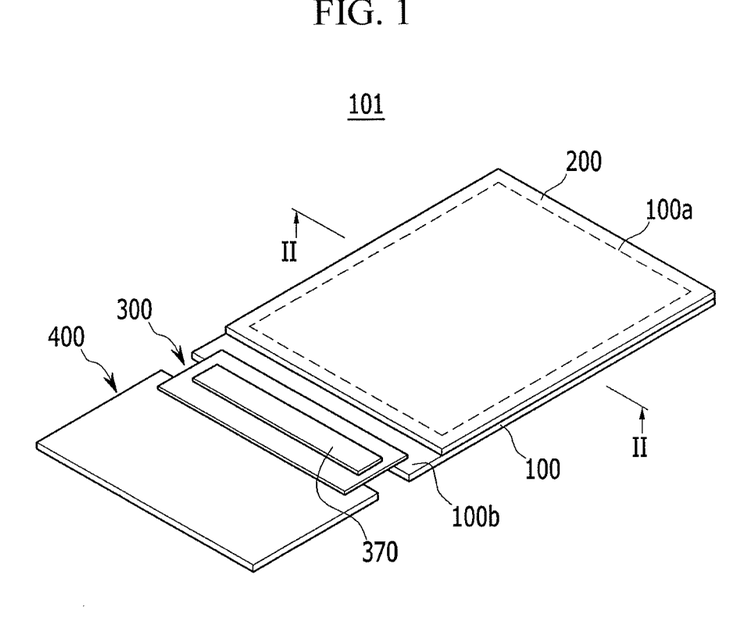
FIG. 1 is a perspective view illustrating a display device according to an exemplary embodiment.

FIG. 1 is a perspective view illustrating a display device according to an exemplary embodiment.

As illustrated in FIG. 1, a display device according to an exemplary embodiment includes a wire substrate 100, an encapsulation substrate 200, a chip on film 300, and a printed circuit board 400.

The encapsulation substrate 200 has a smaller area than the wire substrate 100, and covers the wire substrate 100. The encapsulation substrate 200 is formed as an insulating substrate made of glass, quartz, ceramic, plastic or the like. A display area 100a for displaying pixels and a non-display area 100b are formed at the wire substrate 100. The non-display area 100b is formed at one lateral end portion of the wire substrate 100 and is exposed without being covered by the encapsulation substrate 200.

Figure 2:
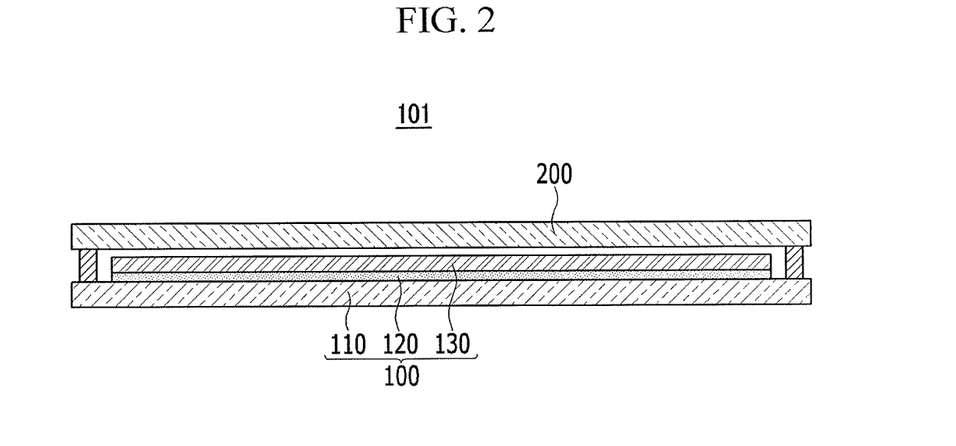
FIG. 2 is a cross-sectional view taken along line II-II of FIG. 1.

FIG. 2 is a cross-sectional view taken along line II-II of FIG. 1.

As illustrated in FIG. 2, the wire substrate 100 includes a substrate main body unit 110, a wire unit 120, and a display element 130.

The substrate main body unit 110 is formed as an insulating substrate made of glass, quartz, ceramic, plastic or the like. However, an exemplary embodiment is not limited thereto, and the substrate main body unit 110 may be formed as a metallic substrate made of a stainless steel or the like.

The wire unit 120 and the display element 130, which are formed on the substrate main body unit 110, are positioned between the substrate main body unit 110 and the encapsulation substrate 200.

The wire unit 120 includes a switching thin film transistor 10 and a driving thin film transistor 20, and drives the display element 130. The display element 130 is composed of an organic light emitting element, and emits light according to a driving signal transmitted from the wire unit 120.

Figure 3:
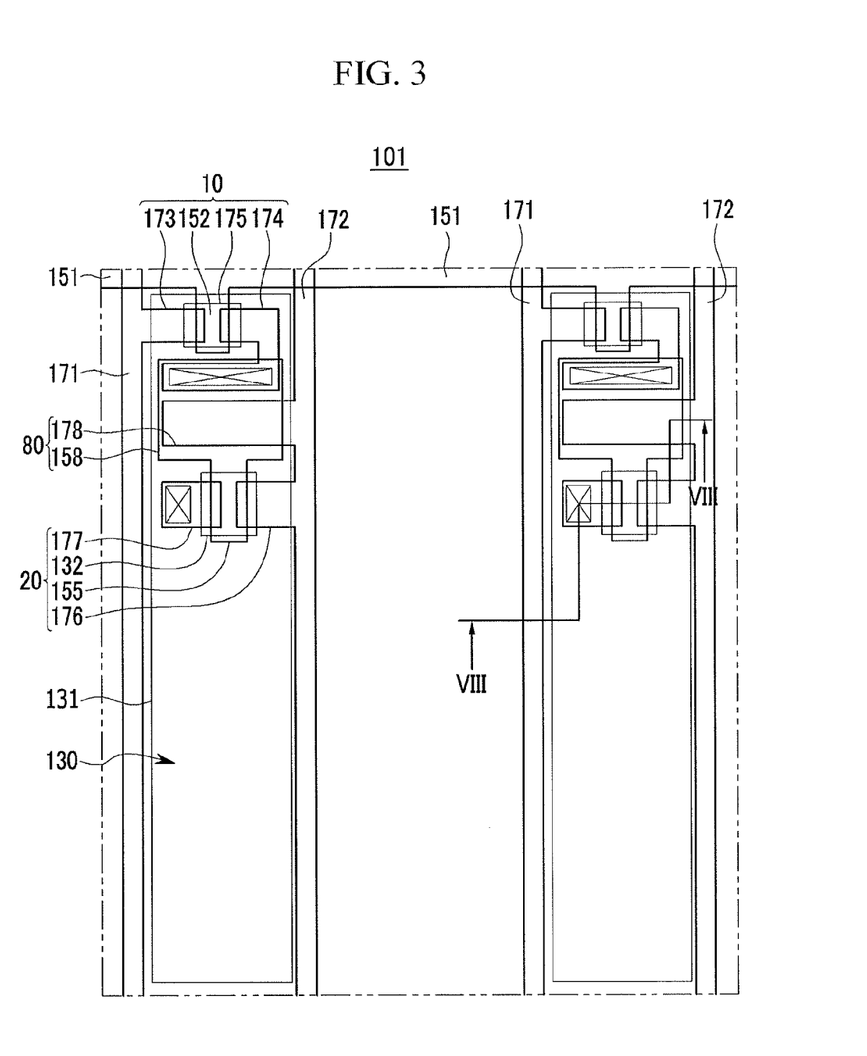
FIG. 3 is a layout view illustrating a structure of pixels in the display device according to the exemplary embodiment.
Figure 4:
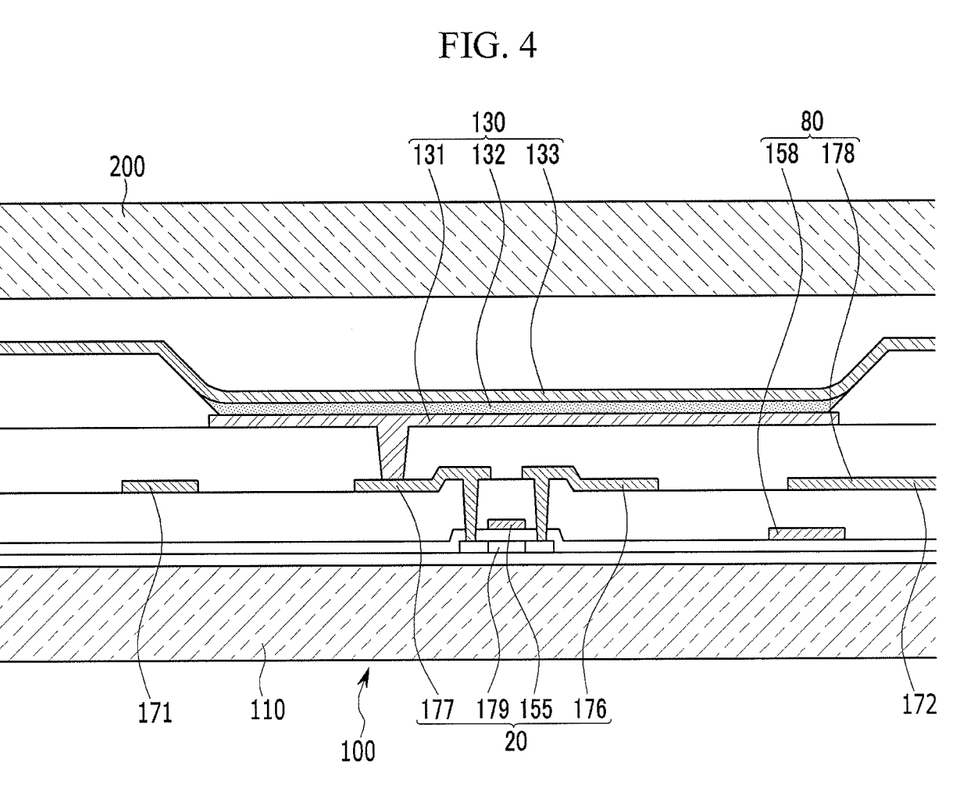
FIG. 4 is a cross-sectional view taken along line IV-IV of FIG. 3.

Specific structures of the display element 130 and the wire unit 120 are illustrated in FIGS. 3 and 4, but an exemplary embodiment is not limited by the structure illustrated in FIGS. 3 and 4. The display element 130 and the wire unit 120 may be formed in various structures within the range in which those skilled in the art can readily make modifications.

Hereinafter, an inner structure of a display device 101 will be described in detail with reference to FIGS. 3 and 4.

FIG. 3 is a layout view illustrating a structure of pixels in the display device according to the first exemplary embodiment. FIG. 4 is a cross-sectional view taken along line IV-IV of FIG. 3.

As illustrated in FIGS. 3 and 4, the display device 101 includes a switching thin film transistor 10, a driving thin film transistor 20, a capacitor 80, and a display element 130, which are formed in each one pixel, respectively. Here, the configuration including the switching thin film transistor 10, the driving thin film transistor 20, and the capacitor 80 is referred to as the wire unit 120. In addition, the wire unit 120 further includes a gate line 151 disposed along one direction of the substrate main body unit 110, and a data line 171 and a common power line 172 that insulatively cross the gate line 151. Here, a boundary of one pixel may be defined by the gate line 151, the data line 171, and the common power line 172, but it is not necessarily limited thereto.

The display element 130 includes a first electrode 131, an organic emission layer 132 formed on the first electrode 131, and a second electrode 133 formed on the organic emission layer 132. Here, the first electrode 131 is a positive (+) electrode as a hole injection electrode, and the second electrode 133 is a negative (−) electrode as an electron injection electrode. However, the exemplary embodiment is not limited thereto, and the first electrode 131 may be a negative electrode and the second electrode 133 may be a positive electrode according to the driving method of the display device 101. Holes and electrons are respectively injected into the organic emission layer 132 from each of the first electrode 131 and the second electrode 133. When excitons generated by combining the injected holes and the electrons injected into the organic emission layer 132 with each other are transitioned from an excited state to a ground state, light is emitted from the organic emission layer 132.

Further, in the display device 101 according to an exemplary embodiment, the display element 130 emits light in a direction toward the encapsulation substrate 200. That is, the display element 130 may be a top emission type. Here, for the display element 130 to emit light in the direction toward the encapsulation substrate 200, the first electrode 131 is made of a light reflective conducting material and the second electrode 133 is made of a light transmittance conducting material.

The capacitor 80 includes a pair of capacitor electrode plates 158 and 178, which are disposed with an interlayer insulating layer 155 interposed therebetween. Here, the interlayer insulating layer 155 functions as a dielectric. Capacitance of the capacitor 80 is determined depending upon electrical charges charged at the capacitor 80 and voltages applied to both capacitor electrode plates 158 and 178.

The switching thin film transistor 10 includes a switching semiconductor layer 175, a switching gate electrode 152, a switching source electrode 173, and a switching drain electrode 174. The driving thin film transistor 20 includes a driving semiconductor layer 179, a driving gate electrode 155, a driving source electrode 176, and a driving drain electrode 177.

The switching thin film transistor 10 is used as a switching element for selecting pixels to emit light. The switching gate electrode 152 is connected to the gate line 151. The switching source electrode 173 is connected to the data line 171. The switching drain electrode 174 is disposed to be separated from the switching source electrode 173, and is connected to the capacitor electrode plate 158.

The driving thin film transistor 20 applies driving electric power to the first electrode 131 to emit light from the organic emission layer 132 of the display element 130 in the selected pixel. The driving gate electrode 155 is connected to the capacitor electrode plate 158 that is connected to the switching drain electrode 174. The driving source electrode 176 and the other capacitor electrode plate 178 are connected to the common power line 172, respectively. The driving drain electrode 177 is connected to the first electrode 131 of the display element 130 through a contact hole.

The switching source electrode 173, the switching drain electrode 174, the driving source electrode 176, and the driving drain electrode 177 are formed in the same layer, and are made of the same material as conductive pads 141 and 161 that will be described below. That is, the switching source electrode 173, the switching drain electrode 174, the driving source electrode 176, and the driving drain electrode 177 are formed together by the same process as the conductive pads 141 and 161, thereby being connected to each other.

With the above structure, the switching thin film transistor 10 is operated by a gate voltage applied to the gate line 151, and serves to transmit a data voltage applied to the data line 171 to the driving thin film transistor 20. A voltage corresponding to a difference between a common voltage applied to the driving thin film transistor 20 from the common power line 172 and a data voltage transmitted from the switching thin film transistor 10 is stored at the capacitor 80, and a current corresponding to the voltage stored at the capacitor 80 flows to the display element 130 through the driving thin film transistor 20, thereby emitting light from the display element 130.

Figure 5:
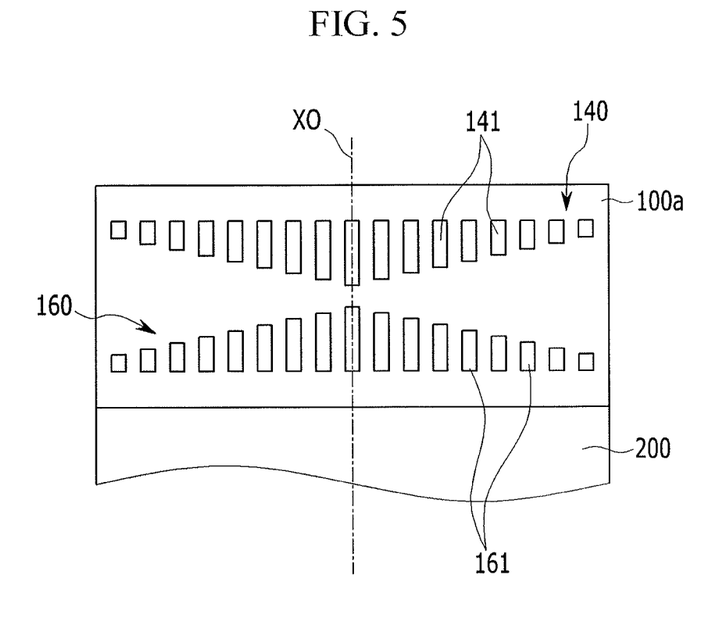
FIG. 5 is a top plan view illustrating a non-display area according to the exemplary embodiment.

FIG. 5 is a top plan view illustrating a non-display area according to an exemplary embodiment.

As illustrated in FIG. 5, conductive pads 141 and 161 are formed at the non-display area, and connected to the wire unit 120. In more detail, the conductive pads 141 and 161 are connected to the switching source electrode 173, the switching drain electrode 174, the driving source electrode 176, and the driving drain electrode 177. The conductive pads 141 and 161 are positioned to correspond to bumpers 332 and 342 of the chip on film 300, and are connected to the chip on film 300 by an anisotropic conductive film 500.

The conductive pads 141 and 161 are disposed in the non-display area 100b to be spaced apart from each other along a side direction of the substrate. In addition, the conductive pads 141 and 161 are disposed in the non-display area 100b in two rows so as to form a first pad row 140 and a second pad row 160. The first pad row 140 and the second pad row 160 are disposed to be separated from each other at a predetermined distance. The distance between the first pad row 140 and the second pad row 160 is shorter at a center portion than at both lateral end portions. Further, the distance between the first pad row 140 and the second pad row 160 is gradually increased from the center portion to both lateral end portions.

To provide this configuration, the lengths of the conductive pads 141 and 161 positioned at the center portion are greater than the lengths of the conductive pads 141 and 161 positioned at both lateral end portions, and the lengths of the conductive pads 141 and 161 are gradually decreased from the center portion to both lateral end portions. For example, a difference in length between the conductive pads 141 and 161 neighboring each other may be about 3 μm to about 7 μm. That is, the conductive pads 141 and 161 positioned at an inner side are greater in length by about 3 μm to about 7 μm than the conductive pads 141 and 161 positioned at an outer side and neighboring the conductive pads 141 and 161 positioned at the inner side.

Meanwhile, the first pad row 140 and the second pad row 160 are symmetrical to each other. The ends of the conductive pads 141 and 161 facing each other are disposed at positions different from each other, and the ends facing away from each other are disposed side by side.

Figure 6:
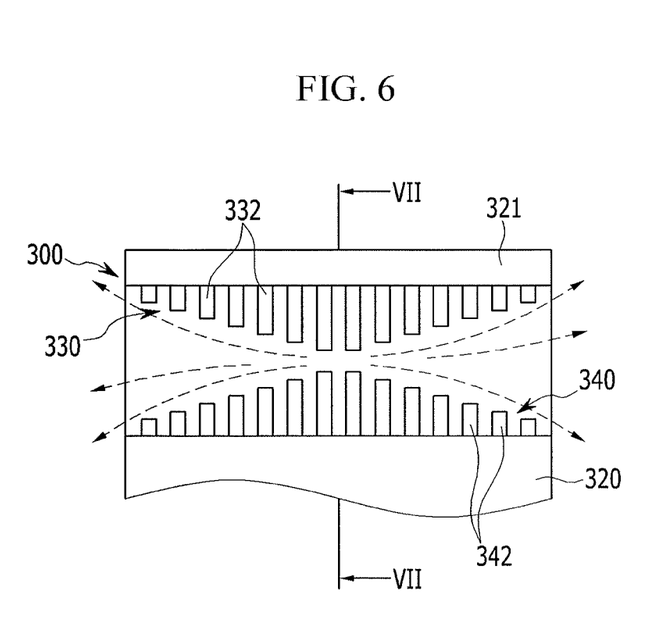
FIG. 6 is a top plan view illustrating a part of a chip on film according to the exemplary embodiment.
Figure 7:
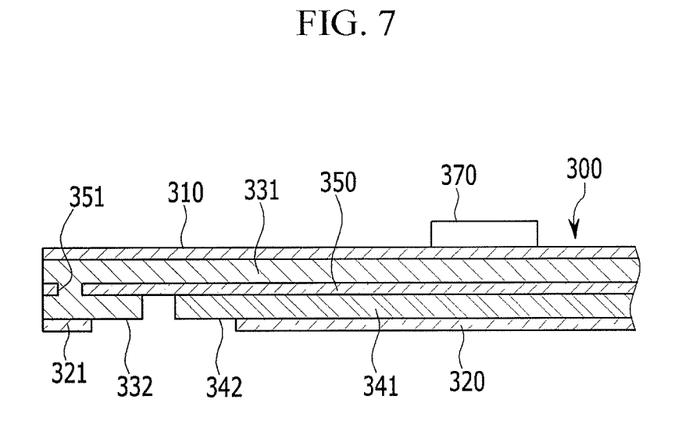
FIG. 7 is a cross-sectional view taken along line VII-VII of FIG. 7.

FIG. 6 is a top plan view illustrating a part of the chip on film according to the first exemplary embodiment, and FIG. 7 is a cross-sectional view taken along line VII-VII of FIG. 7.

Referring to FIG. 6 and FIG. 7, the chip on film includes a first insulation layer 320, a first wire layer 341 formed on the first insulation layer 320, a second insulation layer 350 formed on the first wire layer 341, a second wire layer 331 formed on the second insulation layer 350, a cover layer 310 formed on the second wire layer 331, a driving chip 370 formed on the cover layer 310 and connected to the first wire layer 341 and the second wire layer 331.

The first wire layer 341 is disposed to be separated from a front end of the chip on film 300, and a part of the first wire layer 341 is exposed by partially removing the first insulation layer 320. Here, the exposed part of the first wire layer 341 forms a conductive bumper 342.

Meanwhile, the second wire layer 331 is formed to be connected to a portion where the first wire layer 341 is positioned through a hole 351 formed in the second insulation layer 350, and positioned at the front end of the chip on film 300 to be separated from the first wire layer 341. The second wire layer 331 is partially exposed by the partially removed first insulation layer 320, and the exposed part of the second wire layer 331 forms a conductive bumper 332.

The conductive bumpers 332 and 342 are disposed at an area where the conductive pads 141 and 161 meet with the chip on film 300. A plurality of conductive bumpers 332 and 342 are disposed to be separated from each other in a side direction of the chip on film 300.

The conductive bumpers 332 and 342 are disposed in two rows so as to form a first bumper row 330 and a second bumper row 340. The first bumper row 330 and the second bumper row 340 are disposed to be separated from each other at a predetermined distance. The distance between the first bumper row 330 and the second bumper row 340 is shorter at the center portion than at both lateral end portions. In addition, the distance between the first bumper row 330 and the second bumper row 340 is gradually increased from the center portion to both lateral end portions.

To provide this configuration, the lengths of the conductive bumpers 332 and 342 positioned at the center portion are greater than the lengths of the conductive bumpers 332 and 342 positioned at both lateral end portions, and the lengths of the conductive bumpers 332 and 342 are gradually decreased from the center portion to both lateral end portions. For example, a difference in length between the conductive bumpers 332 and 342 neighboring each other may be about 3 μm to about 7 μm. That is, the conductive bumpers 332 and 342 positioned at an inner side are greater in length by about 3 μm to about 7 μm than the conductive bumpers 332 and 342 positioned at an outer side and neighboring the conductive bumpers 332 and 342 positioned at the inner side.

Meanwhile, the first bumper row 330 and the second bumper row 340 are symmetrical to each other. The ends of the conductive bumpers 332 and 342 facing each other are disposed at positions different from each other, and the ends facing away from each other are disposed side by side.

Figure 8:
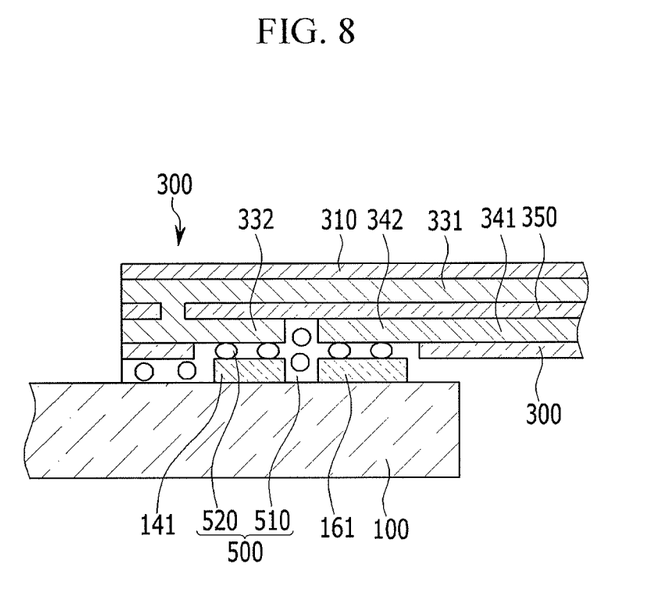
FIG. 8 is a cross-sectional view illustrating a state in which the conductive pad and the conductive bumper according to the exemplary embodiment are bonded with each other.

FIG. 8 is a cross-sectional view illustrating a state in which the conductive pad and the conductive bumper according to the first exemplary embodiment are bonded with each other.

Referring to FIG. 8, the conductive pads 141 and 161 and the conductive bumpers 332 and 342 are bonded to each other by the anisotropic conductive film 500. The anisotropic conductive film 500 includes an adhesive layer 510 and conductive balls 520.

The adhesive layer 510 is positioned between the chip on film 300 and the wire substrate 100 and serves to bond the chip on film 300 and the wire substrate 100. A plurality of conductive balls 520 are positioned in the adhesive layer 510. The adhesive layer 510 inhibits or prevents the neighboring conductive balls 520 from shorting with each other.

The conductive balls 520 are dispersed in the adhesive layer 510. The conductive balls 520, among the plurality of conductive balls 520, which are positioned between the conductive pads 141 and 161 and the conductive bumpers 332 and 342, directly connect the conductive pads 141 and 161 and the conductive bumpers 332 and 342.

The conductive balls 520 are in a state in which the conductive balls 520 are pressed and compressed by the conductive pads 141 and 161 and the conductive bumpers 332 and 342. The conductive balls 520 exert contact pressure on the conductive pads 141 and 161 and the conductive bumpers 332 and 342 by elastic restoring force.

In order to implement full HD grade resolution, the number of conductive pads 141 and 161 may be increased by twice or thrice as much in comparison with a case of not implementing full HD grade resolution. However, if the widths of the conductive pads 141 and 161 are decreased so as to increase the number of conductive pads 141 and 161, the flow of the adhesive layer 510 may deteriorate and fine alignment may not be precisely performed.

According to present exemplary embodiments, the conductive pads 141 and 161 are formed in two rows. However, the conductive pads 141 and 161 and the conductive bumpers 332 and 342, which have a pattern of the two-row structure, could restrict flow of the adhesive layer 510, in comparison with a one-row structure.

In the one-row structure, three sides are open. Accordingly, the adhesive layer 510 may easily move to the opened sides. However, in the case of the two-row structure, only two sides are open and mobility of the adhesive layer 510 may deteriorate due to a narrow path between the pad rows 140 and 160. In a case in which the mobility of the adhesive layer 510 deteriorates, the conductive balls 520 may not be uniformly dispersed, or the conductive pads 141 and 161 and the conductive bumpers 332 and 342 may not be stably bonded with each other because a compressive force cannot be uniformly applied to the conductive balls 520.

However, as in the present exemplary embodiment, in a case in which the distance between the conductive pads 141 and 161 and the distance between the conductive bumpers 332 and 342 are increased from the center portion to one or both lateral end portions, the adhesive layer 510 may be easily dispersed through a path between the two rows.

Figure 9A:
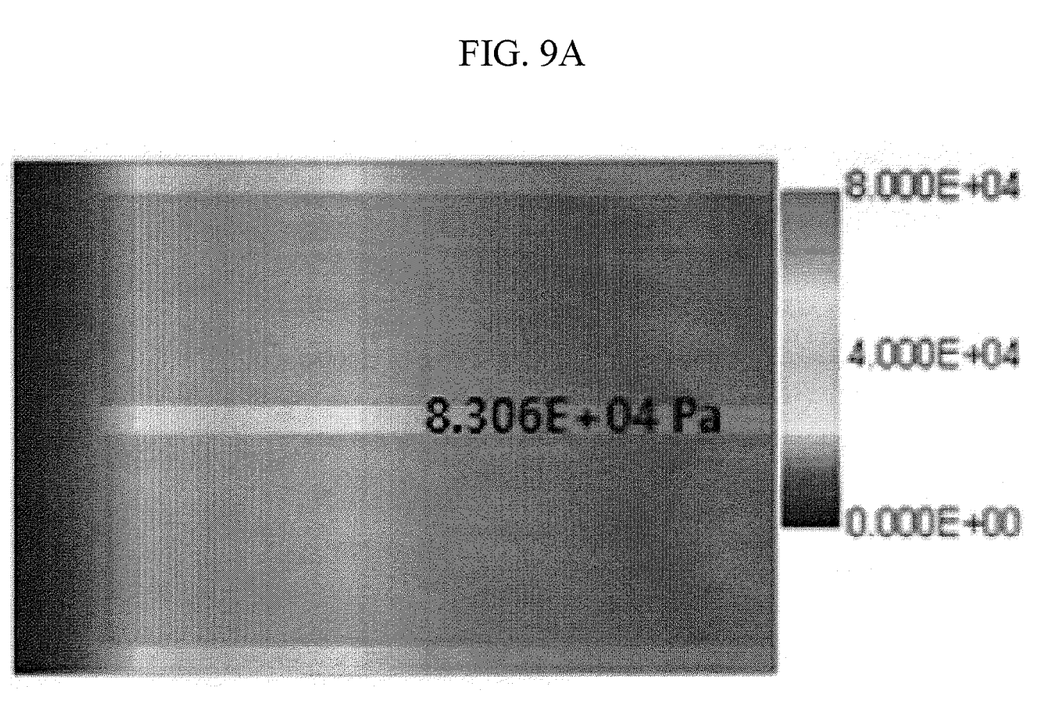
FIG. 9A is a graph illustrating pressure necessary for the conductive pads and the conductive bumpers, which are disposed at uniform distances from each other.
Figure 9B:
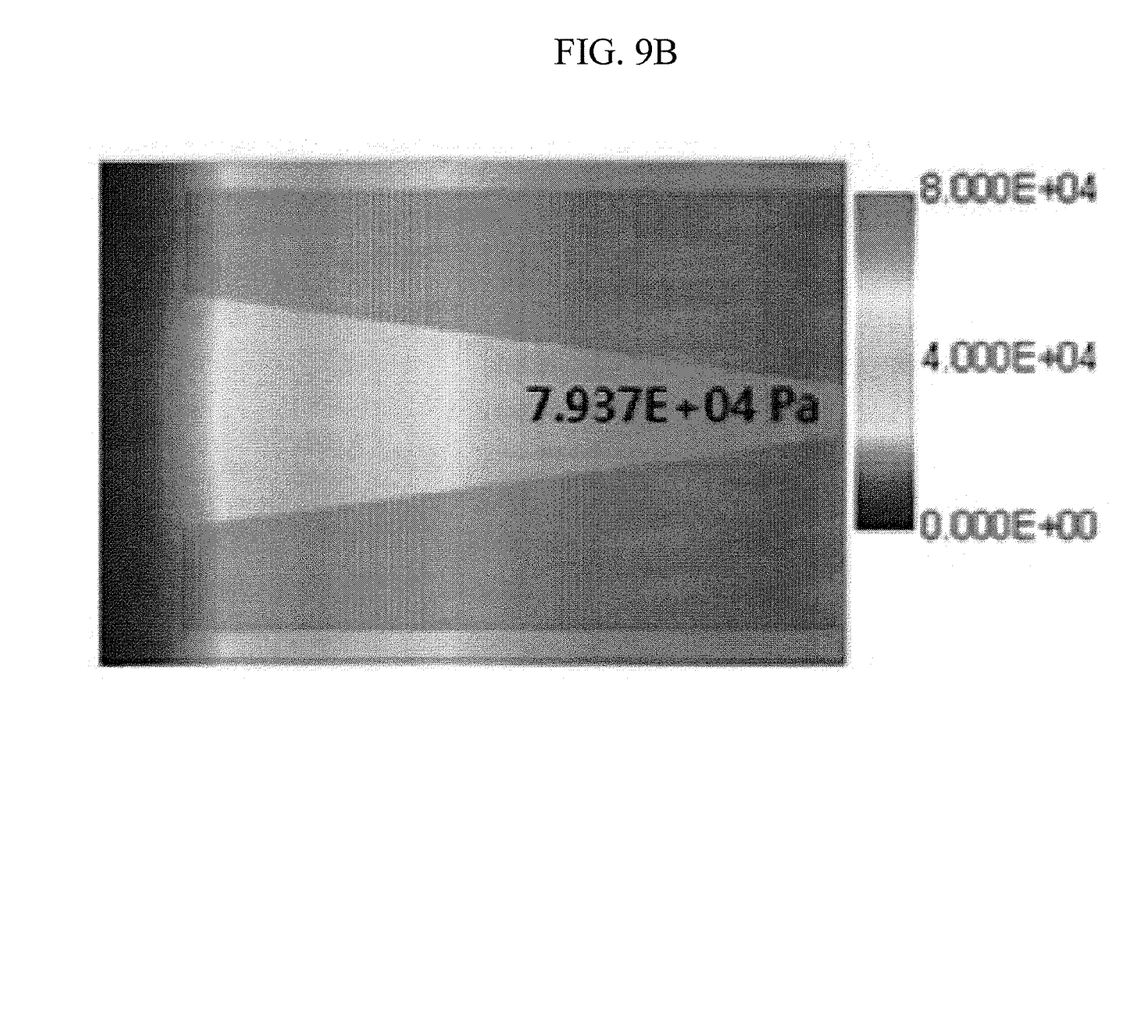
FIG. 9B is a graph illustrating pressure necessary for the conductive pads and the conductive bumpers according to the present exemplary embodiment.

FIGS. 9A and 9B respectively illustrate pressure when the conductive pads 141 and 161 and the conductive bumpers 332 and 342 may be stably bonded with each other by the conductive balls 520, and illustrate the pressure between the centerline XO depicted in FIG. 5 and one lateral end portion. A length of a basic pad is 1000 μm, and a distance between the conductive pads is 23 μm. The lengths of the conductive pads according to the present exemplary embodiment are decreased toward the outer side by 5 μm from 1000 μm.

It may be known that a pressure of 83 kPa is necessary in a case in which the distance is uniform, as illustrated in FIG. 9A, but a pressure of 79 kPa is necessary in the case of the present exemplary embodiment, as illustrated in FIG. 9B. The pressure is described as an example in FIGS. 9A and 9B, and the necessary pressure represents the fluidity of the adhesive layer 510, as an example. It may be known that the fluidity is improved in the case of the present exemplary embodiment, in comparison with the related art.

Figure 10:
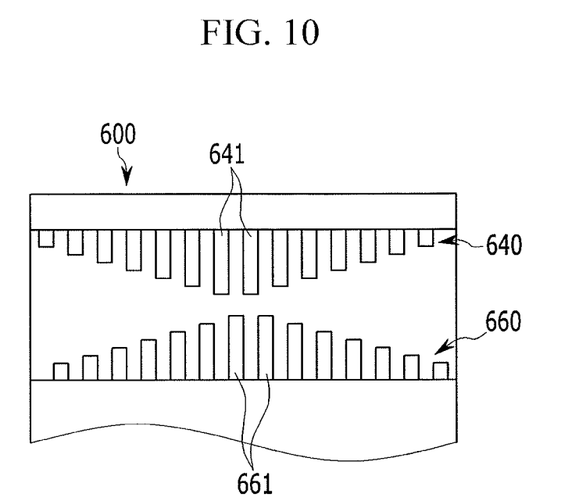
FIG. 10 is a top plan view illustrating a part of a chip on film according to another exemplary embodiment.

FIG. 10 is a top plan view illustrating a part of a chip on film according to another exemplary embodiment.

Referring to FIG. 10, a first bumper row 640 and a second bumper row 660 are formed at a chip on film 600 according to the present exemplary embodiment. The first bumper row 640 is formed with a plurality of conductive bumpers 641, and the second bumper row 660 is disposed to be separated from the first bumper row 640 and is formed with a plurality of conductive bumpers 661.

The distance between the first bumper row 640 and the second bumper row 660 is increased from the center to the outer side. In addition, the conductive bumper 641 in the first bumper row 640 is disposed so as to not be aligned with the conductive bumper 661 in the second bumper row 660. That is, the conductive bumper 661 is disposed at a position corresponding to a position between the conductive bumpers 641, and centerlines of the conductive bumpers 641 and 661 are not in a straight line. As such, when the conductive bumpers 641 and 661 are disposed so as not to be aligned with each other, the adhesive layer 510 may easily move into a space between the conductive bumpers 641 and 661 when compression is performed.

Further, because the conductive pads are disposed in the same structure as the conductive bumpers, the conductive pads, which form neighboring pad rows, are also disposed so as not to be aligned with each other.

Figure 11:
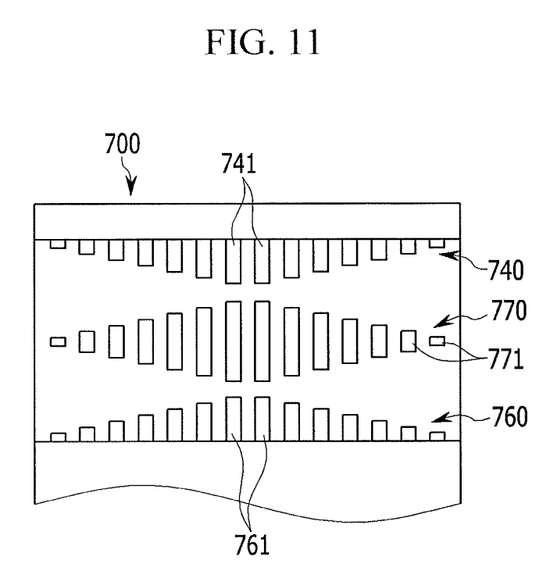
FIG. 11 is a top plan view illustrating a part of a chip on film according to another exemplary embodiment.

FIG. 11 is a top plan view illustrating a part of a chip on film according to another exemplary embodiment.

Referring to FIG. 11, a first bumper row 740, a second bumper row 760, and a third bumper row 770 are formed at a chip on film 700 according to the present exemplary embodiment. The first bumper row 740 is formed with a plurality of conductive bumpers 741, the second bumper row 760 is disposed to be separated from the first bumper row 740 and is formed with a plurality of conductive bumpers 761, and the third bumper row 770 is disposed between the first bumper row 740 and the second bumper row 760 and is formed with a plurality of conductive bumpers 771.

The distance between the first bumper row 740 and the third bumper row 770 is increased from the center to the outer side, and the distance between the second bumper row 760 and the third bumper row 770 is also increased from the center to the outer side.

To provide this configuration, the lengths of the conductive bumpers 741, 761 and 771 are gradually decreased from the center to the outer side. In addition, positions of both ends in a length direction of the conductive bumpers 771, which form the third bumper row 770, are changed from the center to the outer side. Both of the ends of the conductive bumper 771 positioned at an inner side, are more protruded than both of the ends of the conductive bumper 771 positioned at an outer side. Therefore, fluidity of the adhesive layer 510 may be improved because a path between the bumper rows 740, 760 and 770 is increased from the center to the outer side.

Further, because the conductive pads are disposed in the same structure as the conductive bumpers, the conductive pads are also disposed in three rows, and each distance between the conductive pads is gradually increased from the center to the outer side.

By way of summation and review, when a drive chip is manufactured in an integrated circuit chip form and mounted on the display substrate, the drive chip (drive IC) may be mounted on a chip on film to be connected to the pad of the display substrate. In order to implement a display device having full HD resolution, driving output may increased by a factor of two or three or more. Thus, the number of wires formed on the chip on film may also be increased by the same factor, in comparison with a display device not having full HD resolution. If the number of wires on the chip on film is increased, the wires may need to be arranged at a fine pitch. However, the wires arranged at a fine pitch may interrupt the flow of adhesive, thereby deteriorating a compression bonding property and causing a problem in alignment when compression bonding is performed.

In contrast, embodiments provide a display panel, a chip on film, and a display device including the same, having advantages of implementing high resolution by improving the fluidity of an adhesive layer such that a conductive pad and a conductive bumper may be stably coupled with each other.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display panel, comprising:
a display area including a display element; and
a non-display area adjacent to the display area, the non-display area including a plurality of conductive pads,
the conductive pads being spaced apart at a predetermined distance so as to form a first pad row and a second pad row, the conductive pads collectively having a center portion and lateral end portions;
and a distance between the first pad row and the second pad row being greater at at least one of the lateral end portions than at the center portion.

2. The display panel as claimed in claim 1, wherein:
the distance between the first pad row and the second pad row gradually increases from the center portion to the at least one of the lateral end portions.

3. The display panel as claimed in claim 1, wherein, among the conductive pads:
a length of a conductive pad positioned at the center portion of the first pad row is greater than a length of a conductive pad positioned at the at least one of the lateral end portions.

4. The display panel as claimed in claim 3, wherein:
a length of the conductive pad positioned at the center portion of the first pad row is greater than lengths of conductive pads positioned at each of the lateral end portions.

5. The display panel as claimed in claim 3, wherein:
the lengths of the conductive pads gradually decrease from the center portion to each of the lateral end portions.

6. The display panel as claimed in claim 3, wherein:
a difference in length between conductive pads neighboring each other is about 3 µm to about 7 µm.

7. The display panel as claimed in claim 1, wherein:
conductive pads in the first pad row and conductive pads in the second pad row are not aligned with each other.

8. The display panel as claimed in claim 1, further including a third pad row in the non-display area between the first pad row and the second pad row.

9. The display panel as claimed in claim 8, wherein:
a distance between the first pad row and the third pad row gradually increases from the center to at least one of the lateral end portions.

10. A display device, comprising:
a display area including a display element;
a non-display area adjacent to the display area, the non-display area including a plurality of conductive pads;

a chip on film having conductive bumpers that are connected to respective ones of the conductive pads in the non-display area; and a printed circuit board connected to the chip on film, the conductive pads being spaced apart a predetermined distance so as to form a first pad row and a second pad row, the conductive pads collectively having a center portion and lateral end portions, and a distance between the first pad row and the second pad row being greater at at least one of the lateral end portions than at the center portion.

11. The display device as claimed in claim 10, wherein:

the conductive pads and the conductive bumpers are bonded by an anisotropic conductive film including an adhesive layer and a conductive ball disposed in the adhesive layer.

* * * * *